(12) United States Patent
Prouvoyeur et al.

(10) Patent No.: US 11,385,699 B2
(45) Date of Patent: Jul. 12, 2022

(54) INTERFACE DEVICE FOR A PROCESSING UNIT FOR CONNECTING A PLURALITY OF CIRCUITS AND ACQUIRING THEIR STATE VALUE BY MEANS OF A SINGLE INPUT PORT

(71) Applicants: Continental Automotive France, Toulouse (FR); Continental Automotive GmbH, Hannover (DE)

(72) Inventors: Jean-Claude Prouvoyeur, Saint-Jean (FR); Amar Lounnas, Noe (FR); Christophe Pradelles, Fiac (FR)

(73) Assignees: Continental Automotive France; Continental Automotive GmbH

( * ) Notice: Subject to any disclaimer, the term of this patent is extended or adjusted under 35 U.S.C. 154(b) by 401 days.

(21) Appl. No.: 16/339,441

(22) PCT Filed: Nov. 23, 2017

(86) PCT No.: PCT/FR2017/053227
§ 371 (c)(1),
(2) Date: Apr. 4, 2019

(87) PCT Pub. No.: WO2018/096279
PCT Pub. Date: May 31, 2018

(65) Prior Publication Data
US 2020/0042067 A1 Feb. 6, 2020

(30) Foreign Application Priority Data
Nov. 24, 2016 (FR) ...................................... 1661428

(51) Int. Cl.
*G06F 13/14* (2006.01)
*G06F 1/3206* (2019.01)
(Continued)

(52) U.S. Cl.
CPC ............ *G06F 1/3206* (2013.01); *G06F 1/189* (2013.01); *G06F 13/122* (2013.01); *G06F 13/14* (2013.01);
(Continued)

(58) Field of Classification Search
CPC ........ G06F 13/00; G06F 1/3206; G06F 1/189; G06F 13/122; G06F 13/14; G06F 13/4072; H03K 19/017509
See application file for complete search history.

(56) References Cited

U.S. PATENT DOCUMENTS 4,547,056 A * 10/1985 Baumeister ............ G03B 17/00
340/870.14
4,634,843 A 1/1987 Payne
(Continued)

OTHER PUBLICATIONS

Stefan Buntz et al., Tutorial for Wake Up Schemes and Requirements for Automotive Communication Networks, Jun. 4, 2012.*
(Continued)

*Primary Examiner* — Henry Tsai
*Assistant Examiner* — Kim T Huynh
(74) *Attorney, Agent, or Firm* — RatnerPrestia

(57) ABSTRACT

An interface device for a processing unit, allowing a plurality of circuits to be connected to a single input port of the processing unit, capable of acquiring a state value of a circuit of the plurality of circuits, when the circuit is biased, including a plurality, of the same cardinal number, of power sources, each power source being associated with a circuit of the plurality of circuits and capable of biasing same, a switch capable of selectively connecting a single circuit of the plurality of circuits to the associated power source, in such a way as to bias the circuit, and of connecting all of the other circuits to ground, the selection of the biased circuit being controlled by a set of at least one output port of the processing unit.

7 Claims, 3 Drawing Sheets

(51) Int. Cl.
  *G06F 1/18* (2006.01)
  *G06F 13/12* (2006.01)
  *H03K 19/0175* (2006.01)
  *G06F 13/40* (2006.01)

(52) U.S. Cl.
  CPC . *G06F 13/4072* (2013.01); *H03K 19/017509* (2013.01)

(56) References Cited

U.S. PATENT DOCUMENTS

| | | | | |
|---|---|---|---|---|
| 6,704,829 | B1* | 3/2004 | Hoshi | G05B 19/0423 710/1 |
| 7,276,932 | B2* | 10/2007 | Kuang | H03K 19/0016 326/35 |
| 8,786,130 | B1* | 7/2014 | Mori | H01H 59/0009 438/137 |
| 2003/0034799 | A1 | 2/2003 | Chang | |
| 2003/0229403 | A1 | 12/2003 | Nakazawa et al. | |
| 2008/0093452 | A1* | 4/2008 | Will | G06K 7/0021 235/441 |
| 2014/0121787 | A1* | 5/2014 | Yamazaki | G05B 15/02 700/19 |
| 2014/0239886 | A1* | 8/2014 | Lalitnuntikul | H02J 7/00047 320/107 |
| 2015/0277522 | A1* | 10/2015 | Kao | G06F 1/266 713/300 |
| 2016/0335595 | A1* | 11/2016 | Levy | G07C 9/33 |
| 2021/0223302 | A1* | 7/2021 | Silliman | G01R 31/005 |

OTHER PUBLICATIONS

International Search Report and Written Opinion for International Application No. PCT/FR2017/053227, dated Mar. 15, 2018—7 pages.

English Translation of the Written Opinion for International Application No. PCT/FR2017/053227, dated Mar. 15, 2018—6 pages.

\* cited by examiner

INTERFACE DEVICE FOR A PROCESSING UNIT FOR CONNECTING A PLURALITY OF CIRCUITS AND ACQUIRING THEIR STATE VALUE BY MEANS OF A SINGLE INPUT PORT

CROSS REFERENCE TO RELATED APPLICATIONS

This application is the U.S. National Phase Application of PCT International Application No. PCT/FR2017/053227, filed Nov. 23, 2017, which claims priority to French Patent Application No. 1661428, filed Nov. 24, 2016, the contents of such applications being incorporated by reference herein.

FIELD OF THE INVENTION

The present invention relates to an interface device for a processing unit and, more particularly, to an interface device for connecting a plurality of circuits and acquiring their state value by means of a single input port.

BACKGROUND OF THE INVENTION

A processing unit, such as a (micro)processor, a (micro) controller, etc. typically comprises at least one input port, allowing the state value of an electrical circuit connected to said input port to be read, and/or at least one output port, allowing the state of an electrical circuit connected to said output port to be modified, so as to be able to observe and/or act on its surroundings.

According to one known embodiment, more particularly illustrated in the top portion of FIG. 1, exactly one circuit sw1-swn is connected to each input port In1-Inn. Thus, a processing unit µC is sized so as to comprise at least as many input ports In1-Inn as there are circuits sw1-swn to be connected to the processing unit µC. In this embodiment, at most one circuit sw1-swn is connected to one and the same input port In1-Inn.

According to one possible arrangement, a circuit sw1-swn comprises a two-pole circuit, one pole of which is connected to ground and the other pole of which is connected to an input port In1-Inn, optionally through a resistor. This circuit comprises, in series, at least one component sw1-swn that is capable of changing state. This component may be an "all-or-nothing" component. Its state may then be: open or closed, on or off. This is represented by a switch sw1-swn, and in fact the entire circuit sw1-swn is referred to as such. A circuit sw1-swn is biased via a connection to a voltage source Vdd1, Vdd2, of which there may be one or more. It follows that the input port In1-Inn sees a nonzero voltage or logic state of value "1" when the circuit sw1-swn is open, and a zero voltage or logic state of value "0" when the circuit sw1-swn is closed. Thus, acquisition performed by the input port In1-Inn provides a value that allows the state of the circuit sw1-swn to be ascertained. The component may alternatively be analog. Its state may then continually vary between a minimum value and a maximum value. In this case, the input port sees a voltage value that is proportional to the state.

A first drawback of this embodiment is that this sizing results in a cost that increases with the number of ports. Another drawback is that, in precisely sizing the processing unit µC, which is a priori desirable economically speaking, it is no longer possible to connect an additional circuit, the need for which might arise during the service life of the product.

According to another known embodiment, more particularly illustrated in the bottom portion of FIG. 1, it is possible, for the same number of connected circuits sw1-swn, to decrease the number of input ports In1-Inn needed by means of a multiplexer Mux. A multiplexer Mux is an external component allowing several, typically eight, circuits swn+1-swn+8 to be connected. The multiplexer Mux selectively connects, at a given time, one of the circuits swn+1-swn+8 to a single input port Inmux of the processing unit µC. Which connected circuit swn+1-swn+8 is selected is determined by signals Ad0-Ad2 from the processing unit µC. Three such signals Ad0-Ad2, for example "all-or-nothing" signals, allow, for example by means of binary addressing, one circuit out of the eight to be selected. A multiplexer Mux thus makes it possible to change, with time, the circuit that is connected to the input port Inmux so as to read the value of its state and then likewise for each of the circuits swn+1-swn+8, successively. Like the circuits sw1-swn, a circuit swn+1-swn+8 is biased via a connection to a voltage source Vdd1, Vdd2.

A first drawback of this embodiment is the cost, both of purchasing and of installing the multiplexer component Mux. A multiplexer with eight input ports requires one input port Inmux from the processing unit µC, giving an actual gain of seven circuits. Moreover, addressing the multiplexer further requires ports Ad0-Ad2 from the processing unit µC. These ports may however advantageously be reused for other potential multiplexers, via a parallel connection, such as an address bus. Another drawback of this embodiment is that it allows circuits to be added only modulo the capacity of the multiplexer, i.e. modulo seven, and thus it is relatively unsuitable for the addition of only a few (fewer than seven) circuits.

SUMMARY OF THE INVENTION

An aspect of the invention overcomes these drawbacks by means of an interface device allowing a plurality of circuits to be connected to a single input port of the processing unit and their state value to be acquired without requiring a multiplexer or another expensive component.

An aspect of the invention is an interface device for a processing unit, allowing a plurality of circuits to be connected to a single input port of the processing unit, capable of acquiring a state value of a circuit of the plurality of circuits, when said circuit is biased, comprising a plurality, of the same cardinal number, of power sources, each power source being associated with a circuit of the plurality of circuits and capable of biasing same, a switching means capable of selectively connecting a single circuit of the plurality of circuits to the associated power source, in such a way as to bias the circuit, and of connecting all of the other circuits to ground, the selection of the biased circuit being controlled by a set of at least one output port of the processing unit.

According to another feature, the processing unit comprises a plurality of input ports, each input port being connected to a plurality, of at most the same cardinal number as the plurality of power sources, of circuits, the plurality of power sources being unique and reused for all of the input ports, the $i^{th}$ power source being capable of simultaneously biasing the $i^{th}$ circuit connected to each input port.

According to another feature, the switching means is controlled by an output port that is associated with each power source, the control of the $i^{th}$ output port, associated with an $i^{th}$ power source, controlling the biasing of the $i^{th}$ circuit connected to each input port simultaneously and controlling a connection to ground of all of the other circuits.

According to another feature, at least one power source of the plurality of power sources is supplied with power by a first power supply network, while the other power sources are supplied with power by at least a second power supply network that is distinct from the first power supply network.

According to another feature, the first power supply network is a "pre-wakeup" network supplying power to the circuits that have to be supplied with power including after the processing unit has been powered down, and the second power supply network is a "post-wakeup" network supplying power to the circuits that have to be supplied with power once the processing unit has been powered up.

An aspect of the invention also relates to a method for acquiring the state values of at least one plurality of circuits that are connected, respectively, to at least one input port by means of at least one such device, comprising repeating, as many times as there are circuits connected to an input, the following steps: selecting, by controlling the switching means by means of the set of output ports, one of the circuits; acquiring the state value of the selected circuit, for each input port.

BRIEF DESCRIPTION OF THE DRAWINGS

Other features, details and advantages of aspects of the Invention will become more clearly apparent from the detailed description provided below by way of indication with reference to the drawings, in which.

DETAILED DESCRIPTION OF THE PREFERRED EMBODIMENTS

Figure 1:
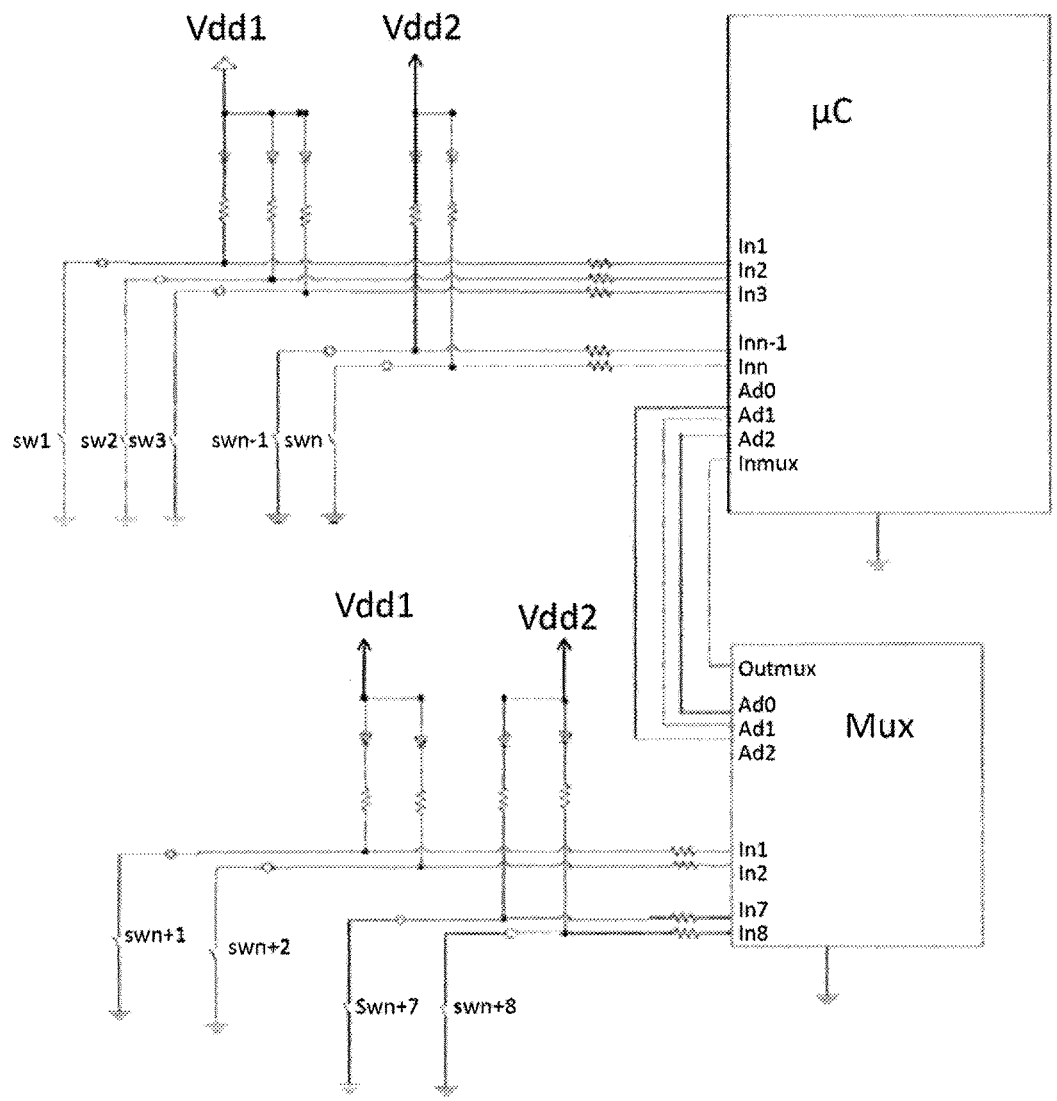
FIG. 1, described above, illustrates an interface device according to the prior art.
Figure 2:
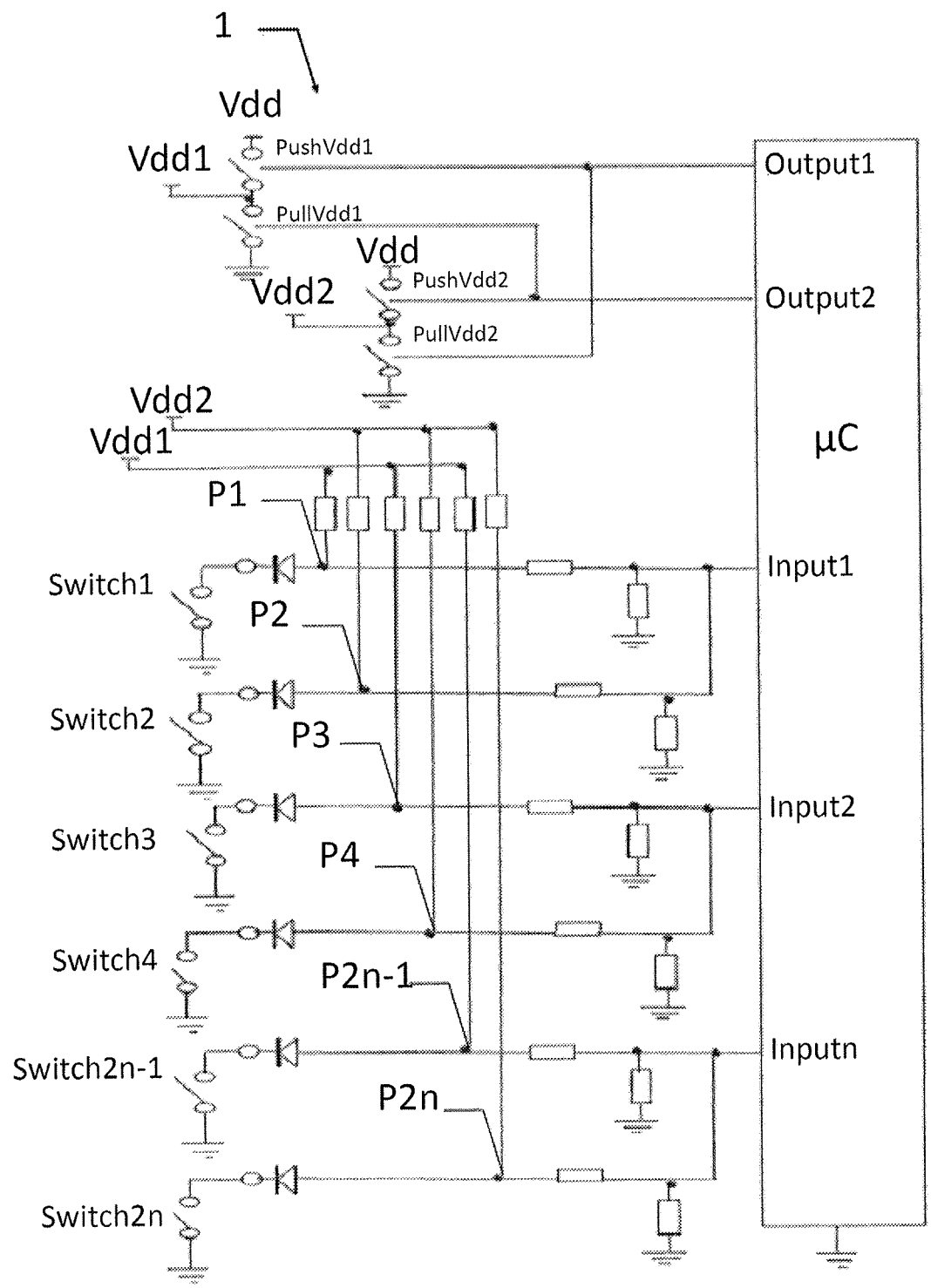
FIG. 2 illustrates an interface device according to an aspect of the invention.

An aspect of the invention relates to an interface device 1 for interfacing between a processing unit μC and circuits Switch1-Switch2n. As illustrated in FIG. 2, one example of such a device 1 according to an aspect of the invention is arranged between a processing unit μC, shown on the right of the figure, and circuits Switch1-Switch2n, shown on the left. The aim of the device 1 is to allow a plurality of circuits Switch1-Switch2n to be connected to a single input port Input1-Inputn of the processing unit μC. As is known and conventional, such an input port Input1-Inputn is capable of acquiring a state value of a circuit Switch1-Switch2n that is connected thereto, when this circuit is biased, as described above in the section introducing the prior art.

To achieve this, an aspect of the invention permanently connects a plurality of circuits, for example two circuits Switch1, Switch2, to an input port, for example Input1. Next, the circuits Switch1-Switch2 of the plurality of circuits Switch1-Switch2n are configured, one at a time, such that the input port Input 1 is able to acquire the value of its state. An input port Input1-Inputn is able to acquire the state value of a circuit Switch1-Switch2n when and only when the circuit is biased. The principle of an aspect of the invention then consists in biasing one of the circuits Switch1-Switch2 of the plurality of circuits connected to the input port Input1 while all of the other circuits of the plurality remain unbiased, and in acquiring the state value. The operation is then repeated for each of the circuits of the plurality of circuits.

To achieve this, the device 1 comprises a plurality of power sources Vdd1-Vdd2 and a switching means Push-Vdd1, PullVdd1, PushVdd2 and PullVdd2.

The plurality of power sources Vdd1-Vdd2 has the same cardinal number as the plurality of circuits that are connected to the input port Input1. There are thus as many power sources Vdd1-Vdd2 as there are circuits Switch1-Switch2 connected to the input port Input1. Each power source Vdd1-Vdd2 is associated with one of the circuits Switch1-Switch2 of the plurality of circuits so as to be able to bias it.

The switching means PushVdd1, PullVdd1, PushVdd2, PullVdd2 makes it possible to determine whether a given power source Vdd1-Vdd2 is biasing or not biasing its associated circuit Switch1-Switch2 by forming or not forming a connection between them. The switching means is further such that when a circuit, for example Switch1, is connected to its associated power source, here Vdd1, and is thus biased, all of the other circuits that are connected to the same input port Input1, here Switch2, are disconnected from their power source, here Vdd2, and are connected to ground, so as not to be biased.

This function of the switching means may be performed by any means. According to one possible embodiment, as illustrated in FIG. 2, a power source Vdd1 or Vdd2 is connected to a connection point P1 or P2, respectively, between the associated circuit Switch1 or the associated circuit, Switch2, respectively, and the input port Input1. The switching means comprises one pair of switches, push and pull, for each power source Vdd1, Vdd2, i.e. four switches PushVdd1, PullVdd1, PushVdd2 and PullVdd2 here. In a push-pull pair, only one of the switches may be controlled (closed) at a given time.

A power source Vdd1-Vdd2 is selectively connected to a power supply network Vdd when it is biasing its associated circuit or to ground when it is not biasing its associated circuit. To achieve this, the push switch, i.e. PushVdd1 or PushVdd2, selectively connects said connection point P1 or P2, respectively, to a voltage source, typically provided by a power supply network Vdd, while the pull switch, i.e. PullVdd1 or PullVdd2, selectively connects said connection point P1 or P2, respectively, to ground.

To bias a circuit, for example Switch1, the push switch, i.e. PushVdd1, that is associated with its associated power source, i.e. Vdd1, is controlled, while the pull switches, i.e. PullVdd2, that are associated with all of the other power sources, i.e. Vdd2, are controlled simultaneously. The remaining switches, here PullVdd1 and PushVdd2, are not controlled and remain open. Thus, one circuit, being connected to its power source, is biased, while all of the other circuits, being connected to ground, are unbiased.

When it is desired to bias another circuit, for example here Switch2, it is the corresponding push switch, i.e. PushVdd2, and all of the other pull switches, i.e. PullVdd1, that are controlled.

The selection of the circuit to be biased from among the circuits of the plurality of circuits that are connected to an input is controlled by a set of at least one output port Output1-Output2 of the processing unit μC. The relationship between the one or more output ports and the switching means may be formed by any means. According to one possible embodiment, illustrated in FIG. 2, one output port Output1-Output2 is associated with each power source Vdd1-Vdd2. This output port Output1-Output2 advantageously simultaneously controls the push switch that is associated with this power source and the one or more pull switches that are associated with all of the other power sources. Thus, the output port Output1 that is associated with the power source Vdd1 simultaneously controls the switch PushVdd1 and the switch PullVdd2. This embodiment requires as many output ports Output1-Output2 as there are power sources Vdd1-Vdd2.

For logic-state (all-or-nothing) circuits, the input port may be logic or analog. For analog-state (proportional) circuits, the input port must be analog. An aspect of the invention is applicable to logic-state circuits, to analog-state circuits and to a combination thereof.

What has been described above for a single input port Input1 may be extrapolated to a plurality of input ports Input1-Inputn of the processing unit μC. It is then possible to connect, to each input port Input1-Inputn, a plurality, of at most the same cardinal number as the plurality of power sources, of circuits Switch1-Switch2n. Each input port allows the connection of at most as many circuits as there are power sources Vdd1-Vdd2.

Thus, if, as illustrated in FIG. 2, there are two power sources Vdd1-Vdd2, it is possible to connect, to each input port Input1-Inputn, at most two circuits. Thus, the input port Input1 is connected to the circuits Switch1 and Switch2, the input port Input2 is connected to the circuits Switch3 and Switch4, . . . , the input port Inputn is connected to the circuits Switch2n−1 and Switch2n.

Advantageously, the plurality of power sources Vdd1-Vdd2 does not have to be duplicated. This one plurality is reused for all of the input ports Input1-Inputn. The first power source Vdd1 is capable of biasing the first circuits Switch1, Switch3, . . . , Switch2n−1 of each input port Input1-Inputn and the second power source Vdd2 is capable of biasing the second circuits, Switch2, Switch4, . . . , Switch2n of each input port Input1-Inputn.

Likewise, the switching means PushVdd1, PullVdd1, PushVdd2 and PullVdd2, which is sized according to the number of power sources Vdd1-Vdd2, may remain unchanged. The switching means PushVdd1, PullVdd1, PushVdd2 and PullVdd2 is controlled by the same set of output ports Output1-Output2. The first power source Vdd1 simultaneously biases the first circuit Switch1 of the first input port Input1 via the point P1, the first circuit Switch3 of the second input port Input2 via the point P3, . . . , the first circuit Switch2n−1 of the $n^{th}$ input port Inputn via the point P2n−1. Likewise, the second power source Vdd2 simultaneously biases the second circuit Switch2 of the first input port Input1 via the point P2, the second circuit Switch4 of the second input port Input2 via the point P4, . . . , the second circuit Switch2n of the $n^{th}$ input port Inputn via the point P2n.

According to one embodiment, as illustrated, the switching means comprises one pair of switches, push and pull, for each power source: PushVdd1, PullVdd1 for the first power source Vdd1 and PushVdd2, PullVdd2 for the second power source Vdd2. The switching means is controlled by an output port Output1-Output2 that is associated with each power source Vdd1-Vdd2, i.e. here two output ports Output1 and Output2.

Controlling the $i^{th}$ output port Output1-Output2, associated with an $i^{th}$ power source Vdd1-Vdd2, controls the biasing of the $i^{th}$ circuit connected to each input port Input1-Inputn, simultaneously for all of the input ports Input1-Inputn. This may be achieved, as illustrated and as described above, by the $i^{th}$ output port controlling the $i^{th}$ push switch and all of the pull switches except the $i^{th}$ one.

Figure 3:
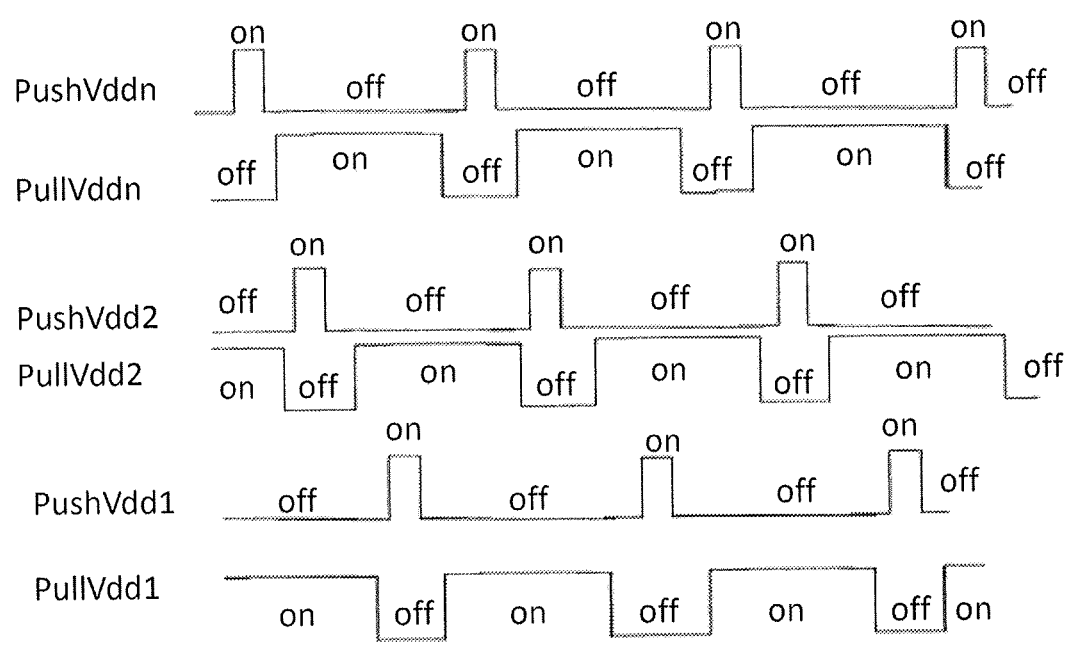
FIG. 3 depicts a timing diagram, specifying the relationships between the control commands of a connecting means.

This is also illustrated by the timing diagram of FIG. 3, depicting n power sources Vdd1, Vdd2, . . . , Vddn, and the timing diagrams associated with their respective push-pull switches: PushVdd1, PullVdd1, PushVdd2, PullVdd2, . . . , PushVddn, PullVddn. The following rules may be adhered to: when a push switch is being controlled (closed/high state/on), its associated pull switch is not being controlled (open/low state/off), none of the other push switches are being controlled, and all of the other pull switches are being controlled.

It should be noted that, in the diagram of FIG. 2, all of the circuits that are associated with a power source are electrically connected. Conversely, two distinct power sources Vdd1-Vdd2 may be electrically separated.

This may be achieved, in the exemplary circuit of FIG. 2, by connecting the power supply point Vdd of the first power source Vdd1 to a first power supply network and the power supply point Vdd of the second power source Vdd2 to a second power supply network, distinct from the first power supply network.

It is then possible to distribute the circuits Switch1-Switch2n over at least two distinct power supply networks, and at most as many distinct power supply networks as there are power sources Vdd1-Vdd2.

This may be advantageous for keeping the circuits Switch1-Switch2n that are supplied with power by different networks separate, even though these circuits are connected to one and the same processing unit μC.

The power supply networks may be distinct in terms of voltage value, in that they have different nominal voltages. Alternatively or in addition, the power supply networks may be temporally distinct, in that they have a different temporal profile.

One example of temporally different power supply networks is those conventionally used in motor vehicles. A first power supply network is what is called, for example, a "pre-wakeup" network, and supplies power to the circuits that have to be supplied with power after the processing unit μC has been powered down/when it is asleep, and, if applicable, also once the processing unit μC has been powered up. A second power supply network is what is called, for example, a "post-wakeup" network, and supplies power to the circuits that have to be supplied with power only once the processing unit μC has been powered up/when it is awake. These two power supply networks have different temporal profiles, the second exhibiting a voltage only when the processing unit μC is powered up and the first exhibiting a voltage over a time period comprising that of the first network, but which is most frequently extended.

An aspect of invention advantageously allows the circuits to be kept separate according to the various power supply networks, while performing the acquisitions from the various circuits using one and the same processing unit μC.

It is possible to distribute the circuits per power supply network modulo the number of power sources. Thus, with four power sources, each power source may be supplied with power by any one of the power supply networks. It is thus possible for each source to be supplied with power by a different network. With two networks, it is possible for two sources to be supplied with power by one network and two other sources to be supplied with power by another network, thus allowing the same number of circuits to be accommodated on each of the networks. Alternatively, it is possible for one source to be supplied with power by one network and three sources to be supplied with power by another network, thus allowing a quarter of the circuits to be accommodated on one of the networks and three quarters of the circuits to be accommodated on the other network.

By means of a device 1 such as described above, it is possible to acquire the state values of at least one plurality of circuits Switch1-Switch2 that are connected to at least one input port Input1 of a plurality of inputs Input1-Inputn, respectively.

This acquisition operation is performed according to the following steps. A first step consists in selecting one of the circuits Switch1-Switch2 of the plurality. This is done by controlling the switching means PushVdd1, PullVdd1, PushVdd2, PullVdd2, typically by means of the set of output ports Output1-Output2. This ensures that the selected circuit is biased, while all of the other circuits that are connected to the same input port are connected to ground. It may be noted that, in the case of several input ports Input-Inputn being present, controlling the switching means advantageously ensures the simultaneous biasing of a single, typically the $i^{th}$, circuit connected to each input port Switch1-Switch2n.

A second step consists in acquiring the state value of each input port Input1-Inputn, thus performing the acquisition from each of the selected circuits.

These two selection/acquisition steps are then repeated as many times as there are circuits Switch1-Switch2 connected to an input Input1-Inputn, so as to scan all of the connected circuits Switch1-Switch2n.

The entire method may be repeated as desired when wanting to perform a new acquisition.

Software being run on the processing unit µC is thus capable of acquiring the state values of all of the circuits Switch1-Switch2n that are connected. Driving the selection operation by controlling the output ports Output1-Output2 of the switching means PushVdd1, PullVdd1, PushVdd2, PullVdd2 makes it possible to ascertain which circuit is selected and biased on each of the input ports Input1-Inputn at a given time and hence which circuit corresponds to an acquired state value.

The invention claimed is:

1. An interface device for a processing unit, allowing a plurality of circuits to be connected to a common input port of the processing unit that is configured to acquire a state value of a circuit of the plurality of circuits, the interface device comprising:
    a plurality of power sources, each power source being associated with a respective one of the plurality of circuits; and
    a switch configured to selectively connect the respective one of the plurality of power sources to a connection point, the connection point permanently connecting the common input port of the processing unit to a single circuit of the plurality of circuits, while connecting ground to remaining connection points, the remaining connection points permanently connecting the common input port of the processing unit to remaining circuits of the plurality of circuits, such that the state value of the single circuit is input to the common input port of the processing unit,
    wherein the switch is controlled by a set of at least one output port of the processing unit.

2. The device as claimed in claim 1, wherein the processing unit comprises a plurality of input ports, each input port being connected to the plurality of power sources, of the plurality of circuits, the plurality of power sources being unique and reused for all of the input ports, the $i^{th}$ power source being capable of simultaneously biasing the $i^{th}$ circuit connected to each input port.

3. The device as claimed in claim 1, wherein the switch is controlled by an output port that is associated with each power source, the control of the $i^{th}$ output port, associated with an $i^{th}$ power source, controlling the biasing of the $i^{th}$ circuit connected to each input port simultaneously and controlling a connection to ground of all of the other of the plurality of circuits.

4. The device as claimed in claim 1, wherein at least one power source of the plurality of power sources is supplied with power by a first power supply network, while the other power sources are supplied with power by at least a second power supply network that is distinct from the first power supply network.

5. The device as claimed in claim 4, wherein the first power supply network is a "pre-wakeup" network supplying power to the plurality of circuits that have to be supplied with power including after the processing unit has been powered down, and the second power supply network is a "post-wakeup" network supplying power to the plurality of circuits that have to be supplied with power once the processing unit has been powered up.

6. A method for acquiring the state values of at least one plurality of plurality of circuits that are connected, respectively, to at least one input port by at least one device as claimed in claim 1, wherein the method comprises repeating, as many times as there are circuits connected to an input:
    selecting, by controlling the switch by the set of output ports, one of the plurality of circuits; and
    acquiring the state value of the selected circuit, for each input port.

7. The device as claimed in claim 2, wherein the switch is controlled by an output port that is associated with each power source, the control of the $i^{th}$ output port, associated with an $i^{th}$ power source, controlling the biasing of the $i^{th}$ circuit connected to each input port simultaneously and controlling a connection to ground of all of the other of plurality of circuits.

* * * * *